June 3, 1969 R. H. ALLMARK 3,448,288

TRANSISTOR LOGICAL CIRCUIT ARRANGEMENTS

Filed Nov. 22, 1965

INVENTOR
Reginald Hugh Allmark
Misegades & Douglas
ATTORNEYS

1

3,448,288
TRANSISTOR LOGICAL CIRCUIT ARRANGEMENTS

Reginald Hugh Allmark, Kidsgrove, Stoke-on-Trent, England, assignor to English Electric Computers Limited, London, England, a British company Filed Nov. 22, 1965, Ser. No. 509,084
Claims priority, application Great Britain, Nov. 27, 1964, 48,377/64
Int. Cl. H03k *19/22*
U.S. Cl. 307—215 7 Claims

ABSTRACT OF THE DISCLOSURE

The specification describes an electric transistor logical circuit arrangement for use in a logical system, in which arrangement (in FIG. 1 and in each half of FIG. 2) an output transistor 5 is controlled by an input control circuit which includes a plurality of input transistors 13 to 15 having their respective collector-emitter paths connected in parallel with one another across the base-collector path of the output transistor. The input transistors are supplied with control signals by AND gate circuits 19 to 21, respectively.

Figure 1:
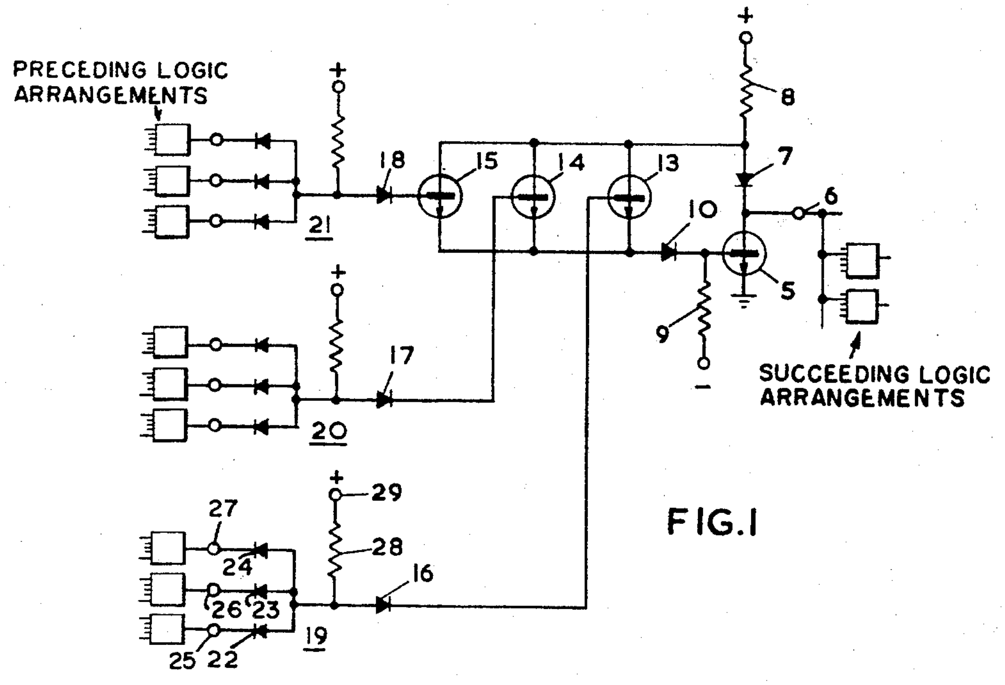

The output transistor 5 is biased off through resistor 9, and is rendered rapidly conductive by a suitable AND gate output signal applied to any of the input transistors. The circuit is such that the output transisor 5 when conducting remains unsaturated regardless of the output load, whilst the condcting input transistor(s) is only slightly saturated.

A diode 10 gives input noise immunity by setting a specific threshold level, and a matched diode 7 is included in the collector circuit of the output transistor so as to compensate for the inclusion of diode 10 in the feedback circuit.

The circuit arrangement has low output impedance, high gain and high fanout capability.

Figure 2:
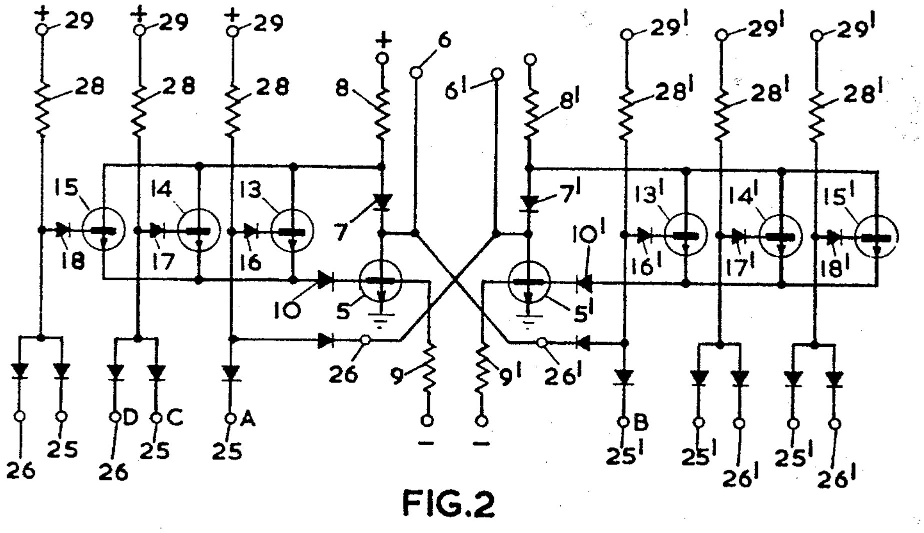

FIG. 2 shows the use of two circuit arrangements of FIG. 1 combined to form a bistable device.

This invention relates to electric transistor logical circuit arrangements such as are used in electric digital computing apparatus, and is concerned with the provision of such circuit arrangements which are suited to production at least in part in the so-called integrated form and which take advantage of the commercial possibilities now offered by this form of construction. The invention also relates to electric transistor logical systems comprising arrays of such logical circuit arrangements.

In electric transistor logical circuit arrangements already known an output transistor has been provided with a collector circuit which includes a resistor, an output circuit terminal connected to the collector of the transistor, a base biasing circuit for biasing the base of the transistor to the nonconductive condition, and a multi-input base control means for varying the potential of the transistor base from the bias value to a coduction valve in accordance with a predetermined logical conbination of a plurality of two state electric signals applied to a plurality of input connections.

With the so-called integrated form of construction a plurality of transistors can now be produced in a single integrated structure at favourable prices so that circuit configurations employing pluralities of cooperating transistors can now be envisaged which if carried out in the past using arrays of discrete transistors would have been economically unjustifiable. The present invention is directed to the provision of electric logical circuit arrangements which use instead of a single transistor a plurality of transistors which cooperate to perform a switching operation of enhanced performance and reliability as compared with those properties of a single transistor, and from which logical systems can be built.

2

According to a first aspect of the present invention an electric logical circuit arrangement is characterized in that the transistor is arranged for grounded-emitter operation, tha tthe base control means comprises a plurality of "input" transistors having their respective bases connected with the respective input connections, their collectors connected to the junction of the collector circuit resistor and the collector of the output transistor, and their emitters connected with the base of the output transistor, and that the base biasing circuit includes a resistor for connecting the base of the output transistor with a source of constant bias potential, the output and input transistors being of the same conductivity type, and the values of the circuit parameters being such that when the input signals are all of a predetermined first state the output transistor is substantially nonconductive and no output current is delivered through the output circuit terminal, and such that when any one of the input signals is of a predetermined second state the associated one of the inpt transistors and the output transistor are conducive, and the potential of the output transistor collector automatically regulates a division of base current in the said associated one of the input transistors between its collector and emitter in a manner such that he output transistor is maintained automatically unsaturated over a predetermined wide range of values of collector current whilst the associated input transistor is lightly saturated.

According to a preferred feature of the present invention two matched voltage-dropping diode elements are connected in the base and collector circuits of the output transistor, one being connected between the base of the output transistor and the interconnected emitters of the input transistors in a sense such as to offer only a low impedance to the flow of base current in the output transistor, and the other being connected between the collector of the output transistor and the junction of the interconnected collectors of the input transistors with the said collector circuit resistor in a sense such as to offer only a low impedance to the flow of collector circuit current in the output transistor.

According to another preferred feature of the present invention at least some of the input connections are supplied with their respective two state electric signals by gating circuit arrangements each of which has a plurality of input terminals for receiving a plurality of two state input signals and supplies to the associated one of the said input connections a two state electric signal dependent upon a predetermined logical combination of the input signals applied to the associated input terminals.

According to yet another preferred feature of the present invention a bistable circuit arrangement comprises an electric logical circuit arrangement according to the present invention having one of the said input terminals of one of the gating circuit arrangements (hereafter referred to as a holding circuit arrangement) connected with the output circuit terminal of another and similar electric logical circuit arrangement, and the output circuit terminal connected with one of the input terminals of one of the gating circuit arrangements of the said other electric logical circuit arrangement (also referred to hereafter as a holding circuit arrangement) whereby the output transistor of either of the two electric logical circuit arrangements can be set to the conductive condition by the simultaneous application of similar input pulse signals to the input terminals of any other one of the gating circuit arrangements of that logical circuit arrangement such as will render the associated input transistor temporarily conducting the output transistor being thereafter maintained conductive by the associated holding circuit arrangement, and can be reset by the application to another input terminal of the associated holding circuit arrangement of a reset pulse signal such as will render that input transistor non-conductive again.

According to another aspect of the present invention an electric logical system comprises an array of electric logical circuit arrangements according to the first-mentioned aspect of the present invention arranged in a cascade manner such that the two-state electric signals supplied to the respective input connections of one logical circuit arrangement are determined by the output circuit terminal potentials of at least two other logical circuit arrangements disposed earlier in the array, and such that the output circuit terminal potential of that logcial circuit arrangement influences the potential supplied as a two-state electric signal to an input connection of one other logical circuit arrangement disposed later in the array.

Other features of the present invention will appear from the following description with reference to the accompanying drawing of two examples of electric logical circuit arrangements according to the present invention, the first arrangement constituting part of an electric logical system according to the present invention, and the second being a bistable logical circuit arrangement. In the drawing FIGURE 1 shows an electric circuit diagram of the first electrical logical circuit arrangement, whilst FIGURE 2 shows an electric circuit diagram of the second arrangement.

Referring now to the arrangement shown in FIG. 1 an "output" transistor 5 of the n-p-n type has its emitter grounded (or earthed), and its collector connected to an output circuit terminal 6, and through a voltage-dropping diode 7 and a collector resistor 8 to a positive tapping of a D.C. power supply. The base of the transistor 5 is connected through a base-biasing resistor 9 to a negative tapping of the power supply.

Three "input" transistors 13–15 of the n-p-n type have their emitter-collector paths connected in parallel, their collectors being connected to the junction of resistor 8 and diode 7, and their emitters being connected through a threshold-setting diode 10 to the base of the output transistor 5.

The bases of the transistors 13–15 are respectively connected through similar voltage-dropping diodes 16–18 to similar AND gates 19–21. Each such AND gate comprises three similar diodes 22–24 having their cathodes connected to input terminals 25–27 respectively and their anodes connected through a resistor 28 to another positive tapping 29 of the power supply.

The operation of the circuit arrangement will now be described. The input terminals 25–27 receive their respective input signals from output terminals (corresponding to output terminal 6) of other similar circuit arrangements (shown at the left hand side of FIGURE 1) which precede the circuit arrangement in the electric logical system, and the output terminal 6 is connected in turn to input terminals of other similar circuit arrangements (shown at the right hand side of FIGURE 1) which succeed the circuit arrangement in the electric logical system.

If in each of the three AND gates 19–21 at least one of the input terminals 25–27 is held sufficiently negative with respect to the positive tapping 29 of the power supply with the diode 22, 23 or 24 connected to that input terminal in each AND gate will conduct. (The AND gate is said to be "shut" in such a case.) Consequently the cathodes of such conducting diodes will be at a low potential (negative with respect to the tapping 29) such that each of the input transistors is held in the nonconducting state. In this condition, the base of the output transistor 5 is held negative with respect to its emitter by the bias potential applied thereto through resistor 9, and the output transistor is nonconducting; a high positive output potential is thus present at the output terminal 6.

If in any of the three AND gates, say for example in gate 19, all of the input terminals 25–27 receive sufficiently high positive potentials, the diodes 22–24 of the AND gate are cut off, so that the potential of the anode of the diode 16 is raised accordingly. (The AND gate is said to be "open" in such a case.) This rise in potential of the anode of diode 16 is transmitted through the diode to the base of input transmitter 13 so that the base current flows in that transistor and that transistor is rendered conductive. As a result the base of output transistor 5 is also raised in potential by normal emitter-follower action, resulting from current flow in resistor 9, until base current starts to flow in the output transistor 5. Thereupon current flow in the transistor 13 is greatly increased by normal transistor action which is now possible due to conduction of the output transistor 5, and a greatly increased current is fed through the collector-emitter circuit of the input transistor 13 and the diode 10 into the base of the output transistor 5. This transistor is rapidly rendered conductive thereby.

As the current flow in the output transistor 5 increases, the increasing voltage drop developed across the collector resistor 8 causes the collector potential of the output transistor to fall. The potential of the collector of the input transistor 13 consequently also falls, and when it becomes comparable in potential with that of the emitter of that input transistor, that transistor saturates. Some of the base current then flowing in the input transistor 13 thereupon transfers from the emitter circuit to the collector circuit of that transistor, and flows to ground through the diode 7 and the collector-emitter path of the output transistor 5, with the result that the base current flowing in the output transistor is controlled at a value sufficient only to support the current flowing in the collector electrode of the output transistor 5. Thus the output transistor is prevented from saturating.

Any tendency for the output transistor to become saturated is automatically countered by a reduction in the share of the input transistor base current which flows in the output transistor base circuit. This reduction results from an increase in the input transistor collector current which follows the tendency for the output transistor collector potential to fall as saturation begins to set in the output transistor.

It will be appreciated that the relationship between the collector and emitter potentials in the input transistor is all important in avoiding saturation in the input transistor. The cicruit parameter values are chosen so that over a predetermined wide range of values of the load circuit current flowing through output terminal 6 the output transistor is maintained free of saturation. Though the input transistor is saturated the degree of saturation is kept small so that it can be rendered nonconductive without any appreciable delay.

If two or more input transistors are simultaneously rendered conductive the base current of the output transistor is shared in inverse proportion to the gains of the conductive input transistors, but the feedback action tending to prevent saturation of the output transistor is unaffected.

The output transistor, being maintained in its nonsaturated condition when conducting, has a high gain and can be rapidly switched from the conductive state to the nonconductive state in response to changes in the signals applied to the input terminals of the AND gates. If the load circuits connected to the output terminal 6 require more current, then this increased current, flowing to earth through the output transistor 5, tends to raise the collector potential of that transistor. This rise is transmitted to the collector of the conducting input transistor 13 which consequently becomes less saturated, or nonsaturated as the case may be, and supplies an increasing base current to the output transistor 5. Thus the conduction of transistor 5 is automatically adjusted to allow the increased load current to flow in the circuits connected to the output tetrminal 6. The logic circuit therefore has a very low output impedance and can supply a large number of circuits.

Furthermore, since the excess base current in the conducting input transistor is absorbed by its collector cicriut the load current carrying capability of the circuit arrangement is rendered virtually independent of the current gains of the transistors employed. This is true up to the condition at which the whole of the base current of the conducting input transistor is required to support the collector current of the output transistor, and even in this condition the current gain approximates to the product of the current gains of the conducting input and output transistors. This product is normally in excess of 400. Therefore the current carrying capacity of the circuit arrangement is limited by circuit dissipation rather than by transistor gain. In contrast, if a single logic switching transistor were to be used in place of the output transistor and the associated conducting input transistor the load current carrying capability woud be limited by the circuit gain to a value well below that determined by collector circuit rating and dissipation.

The various voltage levels at the different points in the circuit are predetermined by the relatively fixed potential drops in the diodes, and across the transistor junctions, and do not depend on resistor values or stability of the power supply. All the diodes used, except the diodes 22–24 are of the type having a very low forward resistance so that the forward potential drops across them are largely independent of current. All the diodes, except diode 10, preferably have a large value of stored charge so that transient changes at their anodes are rapidly transmitted through them.

The potential drops in the diodes 16–18, in the transistors 13–15 and in the diode 10 determine the reverse bias supplied to the base of the output transistor 5 when the AND gates 19–21 are all shut. These potential drops are arranged to set this reverse bias at such a level that, when at least one of the AND gates is open (that is, all its diodes are non-conducting), the output transistor 5 operates at such a level that saturation is avoided in the manner already described and dissipation is minimised. Although the diode 10 assists in fixing the reverse bias, it does not affect the feedback action between the collector and base of the output transistor 5 because its potential drop is balanced in the feedback path by an equal and opposite potential drop in the diode 7. In order to achieve this the diodes 7 and 10 are carefully selected so as to have matched characteristics.

The potential drops inherent in the base-emitter junction of transistors 13–15 and in the diode 10 give a noise immunity of approximately one volt which must be overcome before transistor 5 is affected. This threshold level may be increased by increasing the number of diode elements in the diodes 7 and 10.

The logic circuit arrangement described lends itself to manufacture by integrated circuit techniques because it has few resistors and these are not required to have close tolerances. The circuit consists mostly of transistors and diodes which are more easily and economically manufactured by integrated circuit techniques. Hence in a practical form this circuit arrangement has at least the arroy of input and output transistors constructed as a single integrated structure.

As compared with diode-transistor logical systems as at present used a logical system employing the above described logical circuit arrangement offers considerable saving, in complex systems, in diodes and passive components, and in view of the now favourable costs of multitransistor integrated structures, such a logical system according to the present invention offers at a favourable cost high speed of action, high capacity for driving other circuit arrangements (i.e., a high fanout factor), high reliability, and less dependence on supply potential.

In other similar logical circuit arrangements there may of course be more than three input transistors, additional input transistors being connected in parallel with the three input transistors 13–15 and each having its base connected through a diode to the output of a corresponding additional AND gate.

The low effective output impedance of the circuit arrangement enables the output lines fed from the output terminal 6 to be terminated in the characteristic impedances with consequent reduction in reflections and interference.

The diodes 16–18 may be omitted if desired.

The resistor 9 may, if desired, be given a low ohmic value and be connected to earth instead of to the negative bias potential tapping. This would eliminate the need for a negative potential tapping to be provided for the circuit arrangement.

Two logical circuit arrangements similar to that described above may be combined to form a bistable circuit arrangement for use, for example, in a data register. Such an arrangement is shown in FIG. 2, where the respective logic circuit arrangements are disposed symmetrically on either side of the vertical centre line of the figure. The components of the arrangements bear references which are the same as those allotted to the corresponding components of the FIG. 1, and to distinguish the components of the left hand arrangement from those of the right hand arrangement, the references of the latter have an added superscript, e.g., 5'.

Each of the logical circuit arrangements includes three input transistors as in the arrangement of FIG. 1, but each of the AND gates is provided with only two input terminals, one of the terminals of each of the AND gates being referred to hereafter as a "control" terminal 25, 25', and the other terminal of each of the AND gates being referred to as an "input" terminal 26, 26'.

The two input transistors 13 and 13' are employed as holding circuits for providing positive feedback action between the two output transistor circuits, the input terminals 26 and 26' of these two input transistors being cross-connected with the two output terminals 6' and 6 of the output transistors 5' and 5, respectively.

The other input transistors 14, 15, 14' and 15' are used for the purpose of controlling the states of the output transistors 5 and 5', when required, in accordance with the states of input signals supplied to the respective input terminals 26 and 26' by other similar bistable circuit arrangements, or by gating circuit arrangements similar to that of FIG. 1.

In operation the control terminals 25 associated with the respective input transistors 14, 15, 14' and 15' have supplied to them when required, positive control pulses so as to enable any of these various input transistors to become temporarily conductive if an input signal supplied to the associated input terminal 26 or 26' is simultaneously of a similar positive value. If on the other hand an input signal supplied to the associated input terminal 26 or 26' is simultaneously of a relatively negative value these input transistors remain nonconductive despite the presence of the positive control pulses.

It will be appreciated that conduction in either of the input transistors 14 or 15 renders the output transistor 5 conductive, and that the consequent nonconductive state in the complementary output transistor 5' will result in the application of a positive potential to the input terminal 26 of the associated holding circuit (13). Thus providing a suitably positive potential is simultaneously present at the control terminal 25 of the holding circuit, the holding circuit transistor 13 will become conductive and so maintain the output transistor 5 conductive even after the other input transistor which initiated the conduction in the output transisor has been rendered once more nonconductive.

Similarly, the output transistor 5' will be rendered conductive, and the output transistor 5 nonconductive, if either of its associated input transistors 14' and 15' is rendered temporarily conductive by the combined effect of the associated input and control signal potentials, and it will be maintained in its conductive state by the holding circuit transistor 13' after the input transistor which initiated conduction in the output transistor 5' has been rendered nonconductive.

To use this bi-stable circuit arrangement "complement" output signals derived from appropriate other circuit arrangements are supplied to the input terminals 26 of the left hand input transistors 14 and 15, and "true" output signals derived from the appropriate other circuit arrangements are supplied to the input terminals 26' of the right hand input transistors 14' and 15'.

True output signals are provided by the output terminal 6 of the bistable circuit arrangement, whilst complement output signals are provided by output treminal 6'.

To set the bistable circuit arrangement in accordance with the logical OR function of the input signals applied to the input terminals 26 associated with the left hand input transistors 14 and 15 control pulses are applied to the control terminals 25 associated with the left hand transistors 13–15. Similarly, to set the bistable circuit arrangement in accordance with a logical OR function of the input signals supplied to the input terminals 26' associated with the right hand input transistors 14' and 15' control pulses are applied to the control terminals 25 associated with the right hand input transistors 13'–15'.

Such control pulses are constituted by a negative-going pulse applied to the control terminal associated with the appropriate holding circuit transistor and positive-going pulses applied to the associated other control terminals. The positive-going pulses overlap the corresponding negative-going control pulse, the positive-going pulses beginning before and ending after the negative-going pulse. Thus, if on the application of the control pulses the associated output transistor is already conducting and the input signals then applied to the input treminals require it to remain conducting, the negative-going pulse is ineffective to rest the output transistor to the nonconductive condition. On the other hand if the input signals then require the output transistor to be reset to the nonconductive condition the positive-going pulses are of no effect, and the output tarnsistor is reset at the beginning of the negative-going control pulse, and remains so after the end of the control pulses.

In practice it has been found more convenient to use instead positive and negative-going control pulses of equal duration, and to delay the negative-going pulse slightly in relation to the corresponding positive-going pulses. This delay is effected by using the positive-going pulses to gate the negative-going pulse, and the slightly delay in terminating the negative-going pulse after the positive-going pulse is acceptable provided this delay is less than the response time of an AND gate and the associated input and output transistor circuits.

If the bistable circuit arrangement is required to be set in accordance with the logical OR function of the various input signals applied to the input terminals 26 associated with the two groups of input transistors 14–15 and 14'–15' control pulses are applied simultaneously to both of the respective groups of control terminals 25 and 25'.

The emitter-follower cross-coupling arrangement (e.g., provided by components 13, 10 and 9) results in some speeding-up of operation of the bistable circuit arrangement as compared with that of other bistable circuit arrangements using only two single switching transistors, and ensures that the logic output potential levels are the same as those for the gating circuit arrangement of FIGURE 1. Likewise, the fanout factor of the bistable circuit arrangement is the same as that for the FIGURE 1 gating circuit arrangement. Furthermore, considerable advantage lies in the ability of the bistable circuit arrangement to receive data from a large number of data sources at a relatively low cost, and with a single wire connection only from each such data source.

An electric logical system employing circuit arrangements as described above relies on direct wire connections between the successive circuit arrangements which constitute the successive logical stages in the system, and hence is able to work at very high data transfer rates without the disadvantages which reactive coupling brings in equivalent capacity and transformer coupled logical stages.

What I claim as my invention and desire to secure by Letters Patent is:

1. An electric transistor logical circuit arrangement including an "output" transistor arranged for grounded-emitter operation, an output circuit terminal connected to the collector of the output transistor, a collector circuit which includes in series connection a first diode connected to the collector of the output transistor and a resistor connected to the first diode, a base biasing circuit which includes a resistor for connecting the base of the output transistor to a source of constant bias potential whereby to bias the output transistor to the nonconductive condition, and a base control circuit which includes in series connection a second diode connected to the base of the output transistor, and a base control means connected to the second diode for varying the potential of the base of the output transistor from the bias value of a conduction value in accordance with a predetermined logical combination of a plurality of two state electric signals applied to a plurality of input connections, this base control means comprising a plurality of "input" transistors having their respective bases connected with the respective input connections, their collectors connected together to the junction of the collector circuit resistor and the first diode, and their emitters connected together to the second diode, the output and input transistors being of the same conductivity type, the first and second diodes being matched voltage-dropping diode elements connected so as to present a low impedance to the flow of collector and base currents respectively in the output transistor, and the values of the circuit parameters being such that when the input signals are all of a predetermined first state the output transistor is substantially nonconductive and no output current passes through the output circuit terminal, and such that when any one of the input signals is of a predetermined second state the associated one of the input transistors and the output transistor are conductive, and the potential of the output transistor collector automatically regulates a division of base current in the said associated one of the input transistors between its collector and emitter in a manner such that the output transistor is maintained automatically unsaturated over a predetermined wide range of values of collector current whilst the associated input transistor is lightly saturated.

2. An electric logical system comprising an array of electric logical circuit arrangements according to claim 1 arranged in a cascade manner such that the two state electric signals supplied to the respective input connections of one logical circuit arrangement are determined by the output circuit terminal potentials of at least two other logical circuit arrangements disposed earlier in the array, and such that the output circuit terminal potential of that logical circuit arrangement influences the potential supplied as a two state electric signal to an input connection of one other logical circuit arrangement disposed later in the array.

3. An electric logical circuit arrangement according to claim 1, wherein at least some of the input connections are supplied with their respective two state electric signals by gating circuit arrangements each of which has a plurality of input terminals for receiving a plurality of two state input signals and supplies to the associated one of the said input conections a two state electric signal dependent upon a predetermined logical combination of the input signals applied to the associated input terminals.

4. An electric logical circuit arrangement according to claim 3, wherein one of the said input terminals of one of the gating circuit arrangements (hereafter referred to as a holding circuit arrangement) is connected with the output circuit terminal of another and similar electric logical circuit arrangement, and the output circuit terminal is connected with one of the input terminals of one of the gating circuit arrangements of the said other electric logical circuit arrangement (also referred to hereafter as a holding circuit arrangement) whereby the output transistor of either of the two electric logical circuit arrangements can be set to the conductive condition by the simultaneous application of similar input pulse signals to the input terminals of any other one of the gating circuit arrangements of that logical circuit arrangement such as will render the associated input transistor temporarily conducting, the output transistor being thereafter maintained conductive by the associated holding circuit arrangement, and can be reset by the application to another input terminal of the associated holding circuit arrangement of a reset pulse signal such as will render that input transistor nonconductive again.

5. An electric logical system comprising an array of electric logical circuit arrangements according to claim 3, arranged in a cascade manner such that the input signals supplied to each logical circuit arrangement are derived from the output circuit terminals of logical circuit arrangements disposed earlier in the array.

6. An electrical logical circuit arrangement according to claim 3, wherein each such gating circuit arrangement includes a resistor arranged for connection at one end to a source of electric potential, a plurality of similar diodes connecting the respective input terminals with the other end of the resistor, and a connection for connecting the junction of the resistor with the respective diodes to the associated one of the said input connections, the said similar diodes preventing interaction between input signals.

7. An electric logical circuit arrangement according to claim 6, including in each of the said input connections a diode connected in a sense offering only a low resistance to the flow of base current in the associated input transistor.

References Cited

UNITED STATES PATENTS

| | | | |
|---|---|---|---|
| 3,229,119 | 1/1966 | Bohn et al. | 307—215 X |
| 3,233,125 | 2/1966 | Buie | 307—215 |

DONALD D. FORRER, *Primary Examiner.*

U.S. Cl. X.R.

307—218, 291